(12) United States Patent
Arishima et al.

(10) Patent No.: US 8,553,115 B2
(45) Date of Patent: Oct. 8, 2013

(54) PHOTOELECTRIC CONVERSION APPARATUS AND IMAGING SYSTEM USING THE SAME

(75) Inventors: Yu Arishima, Yokohama (JP); Takashi Matsuda, Yokohama (JP); Toru Koizumi, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 491 days.

(21) Appl. No.: 12/957,537

(22) Filed: Dec. 1, 2010

(65) Prior Publication Data

US 2011/0134270 A1 Jun. 9, 2011

(30) Foreign Application Priority Data

Dec. 9, 2009 (JP) ................................. 2009-279910

(51) Int. Cl.
*H04N 5/335* (2011.01)

(52) U.S. Cl.
USPC ........................................... 348/294; 348/280

(58) Field of Classification Search
USPC .................. 348/308, 280, 294, 270, 266, 302, 348/291; 257/444, 443, 184; 250/208.1
See application file for complete search history.

(56) References Cited

U.S. PATENT DOCUMENTS

| | | | |
|---|---|---|---|
| 5,698,892 A | 12/1997 | Koizumi et al. | 257/620 |
| 6,188,094 B1 | 2/2001 | Kochi et al. | 257/232 |
| 6,670,990 B1 | 12/2003 | Kochi et al. | 348/310 |
| 6,960,751 B2 | 11/2005 | Hiyama et al. | 250/208.1 |
| 7,016,089 B2 | 3/2006 | Yoneda et al. | 358/482 |
| 7,110,030 B1 | 9/2006 | Kochi et al. | 348/308 |
| 7,227,208 B2 | 6/2007 | Ogura et al. | 257/292 |
| 7,294,818 B2 | 11/2007 | Matsuda et al. | 250/208.1 |
| 7,321,110 B2 | 1/2008 | Okita et al. | 250/208.1 |
| 7,324,144 B1 | 1/2008 | Koizumi | 348/294 |
| 7,348,615 B2 | 3/2008 | Koizumi | 257/292 |
| 7,408,210 B2 | 8/2008 | Ogura et al. | 257/233 |
| 7,429,764 B2 | 9/2008 | Koizumi et al. | 257/292 |
| 7,460,162 B2 | 12/2008 | Koizumi et al. | 348/294 |
| 7,466,003 B2 | 12/2008 | Ueno et al. | 257/462 |
| 7,538,810 B2 | 5/2009 | Koizumi et al. | 348/308 |
| 7,550,793 B2 | 6/2009 | Itano et al. | 257/239 |
| 7,554,591 B2 | 6/2009 | Kikuchi et al. | 348/308 |
| 7,605,415 B2 | 10/2009 | Koizumi et al. | 257/291 |
| 7,629,568 B2 | 12/2009 | Koizumi et al. | 250/214 |
| 7,755,688 B2 | 7/2010 | Hatano et al. | 348/300 |
| 7,808,537 B2 | 10/2010 | Fujimura et al. | 348/300 |

(Continued)

FOREIGN PATENT DOCUMENTS

| | | | |
|---|---|---|---|
| JP | 2003-258232 A | | 9/2003 |
| JP | 2006-024907 A | | 1/2006 |
| JP | 2006-279048 A | | 10/2006 |
| JP | 2007-059447 A | | 3/2007 |

*Primary Examiner* — Aung S Moe
(74) *Attorney, Agent, or Firm* — Fitzpatrick, Cella, Harper & Scinto

(57) ABSTRACT

If separations between photoelectric conversion elements are different from each other, charge leaking into adjacent photoelectric conversion elements varies. A photoelectric conversion apparatus of the present invention includes a first semiconductor region that can be potential barriers against signal charge, between first and second photoelectric conversion elements. Further, the apparatus includes a second semiconductor region that has the same depth as the depth of the first semiconductor region and a width narrower than the width of the first semiconductor region and can be potential barriers against the signal charge, between the first and a third photoelectric conversion element. Moreover, the apparatus includes a third semiconductor region that can be potential barriers against the signal charge under the first semiconductor region and the second semiconductor region.

15 Claims, 8 Drawing Sheets

(56) References Cited

U.S. PATENT DOCUMENTS

| | | | |
|---|---|---|---|
| 7,872,286 B2 | 1/2011 | Okita et al. | 257/291 |
| 7,907,196 B2 | 3/2011 | Ogura et al. | 348/308 |
| 2003/0209712 A1 | 11/2003 | Fujita et al. | 257/72 |
| 2006/0214249 A1 | 9/2006 | Nam et al. | 257/432 |
| 2008/0036891 A1 | 2/2008 | Ono et al. | 348/308 |
| 2008/0062294 A1 | 3/2008 | Koizumi et al. | 348/300 |
| 2008/0062296 A1 | 3/2008 | Ogura et al. | 348/308 |
| 2009/0207293 A1 | 8/2009 | Ryoki et al. | 348/308 |
| 2009/0218479 A1 | 9/2009 | Arishima et al. | 250/226 |
| 2010/0002114 A1 | 1/2010 | Ogura et al. | 348/301 |
| 2010/0053396 A1 | 3/2010 | Okita et al. | 348/301 |
| 2010/0060754 A1 | 3/2010 | Ogura et al. | 348/241 |
| 2010/0066881 A1 | 3/2010 | Ryoki et al. | 348/302 |
| 2010/0194947 A1 | 8/2010 | Ogura et al. | 348/301 |
| 2010/0225793 A1* | 9/2010 | Matsuda et al. | 348/280 |
| 2010/0264298 A1 | 10/2010 | Ryoki et al. | 250/208.1 |
| 2011/0068252 A1* | 3/2011 | Kawabata et al. | 250/208.1 |
| 2011/0068253 A1* | 3/2011 | Arishima et al. | 250/208.1 |
| 2011/0080492 A1 | 4/2011 | Matsuda et al. | 348/222.1 |
| 2011/0080493 A1 | 4/2011 | Kono et al. | 348/222.1 |
| 2011/0134270 A1* | 6/2011 | Arishima et al. | 348/222.1 |
| 2013/0092983 A1* | 4/2013 | Matsuda et al. | 257/231 |

* cited by examiner

PHOTOELECTRIC CONVERSION APPARATUS AND IMAGING SYSTEM USING THE SAME

BACKGROUND OF THE INVENTION

1. Field of the Invention

The present application relates to a structure of isolation of a photoelectric conversion apparatus.

2. Description of the Related Art

CCD type and CMOS type photoelectric conversion apparatuses are used for a lot of digital still cameras and digital camcorders. In recent years, in the photoelectric conversion apparatuses, pixels have been reduced. Thus, measures against charge leakage (cross talk) into adjacent pixels that occurs according thereto are discussed.

Japanese Patent Application Laid-Open No. 2003-258232 discloses a configuration where a P type well region, which functions as a barrier for element isolation to prevent charge leakage (cross talk) between adjacent pixels, is formed in a deep region consistent with an N type well region of a photoelectric conversion element.

However, even with the P type well region disclosed in Japanese Patent Application Laid-Open No. 2003-258232, it may be difficult to sufficiently suppress charge leakage.

In general, in the photoelectric conversion apparatus, a transistor for reading charge from a photoelectric conversion element is provided around the photoelectric conversion element. Here, there is a case where the widths of semiconductor regions functioning as element isolation regions for separating the photoelectric conversion elements from each other vary. The inventors of the present invention have found that there is a case where amounts of leakage of charge from P type well regions, which can be element isolation of the photoelectric conversion elements described in Japanese Patent Application Laid-Open No. 2003-258232, may vary according to the widths of the element isolation regions in such situations. If amounts of leakage of signal charge into the adjacent photoelectric conversion elements vary, the image quality is degraded and correction of the image signal becomes difficult.

Thus, it is an object of the present invention to provide a photoelectric conversion apparatus capable of reducing variation in charge leaking into the adjacent photoelectric conversion elements (pixels).

SUMMARY OF THE INVENTION

A photoelectric conversion apparatus according to the present invention comprises: a plurality of photoelectric conversion elements including a first photoelectric conversion element, a second photoelectric conversion element adjacent to the first photoelectric conversion element, and a third photoelectric conversion element adjacent to the first photoelectric conversion element; and a plurality of transistors each for transferring a signal charge generated in each of the plurality of photoelectric conversion elements, wherein the plurality of photoelectric conversion elements and the plurality of transistors are arranged in a semiconductor substrate, and wherein a first semiconductor region of a first width having a first conductivity type so as to contain the signal charge as a minority carrier is arranged between the first and second photoelectric conversion elements, a second semiconductor region of a second width smaller than the first width having the first conductivity type is arranged between the first and third photoelectric conversion elements, and a third semiconductor region of a third width and having the first conductivity type is arranged under the first and second semiconductor regions.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings.

A photoelectric conversion apparatus of the present invention includes a first semiconductor region that can be potential barriers against signal charge arranged in a element isolation region between first and second photoelectric conversion elements. The photoelectric conversion apparatus also includes a second semiconductor region that can be potential barriers against signal charge arranged in an element isolation region between the first and a third photoelectric conversion element. The second semiconductor region has the same depth as the depth of the first semiconductor region and a width narrower than a width of the first semiconductor region. Further, the photoelectric conversion apparatus includes a third semiconductor region that can be potential barriers against signal charge under the first and second semiconductor regions. Such a configuration can suppress that the signal charge generated in the first photoelectric conversion element unevenly leaks into the adjacent second and third photoelectric conversion elements. That is, this configuration enables a cross-talk quantity to be made uniform, thereby improving image quality. Further, even when correction is made, image signals can easily be corrected. Accordingly, a necessary configuration of an image processor can also be made to be simple.

This embodiment will hereinafter be described in detail using drawings.

(Example of Pixel Circuit)

Figure 2A:
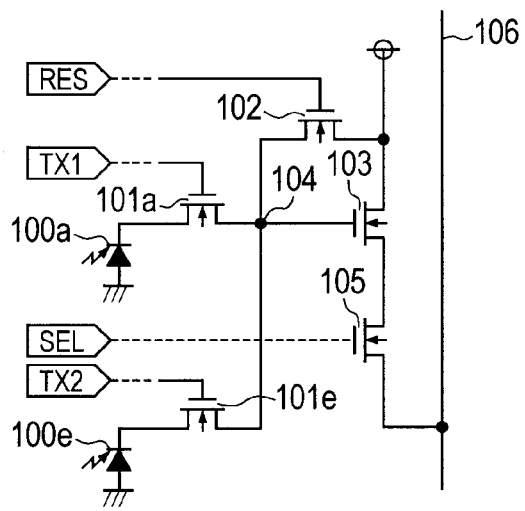
FIG. 2A is a circuit diagram and a planar layout diagram of the photoelectric conversion apparatus illustrating the first embodiment.
Figure 2B:
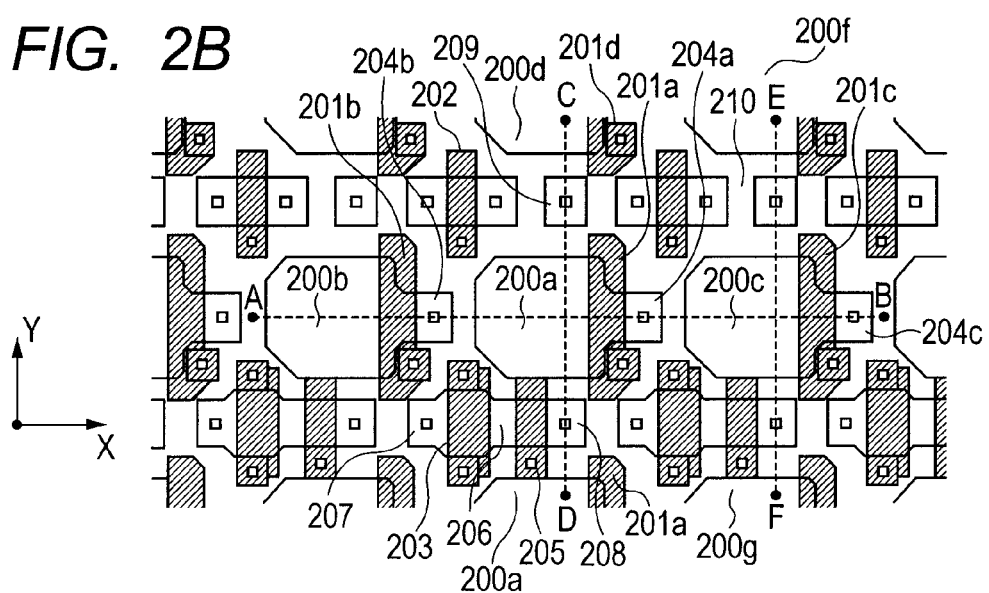
FIG. 2B is a planar layout diagram of the photoelectric conversion apparatus illustrating the first embodiment.
Figure 2C:
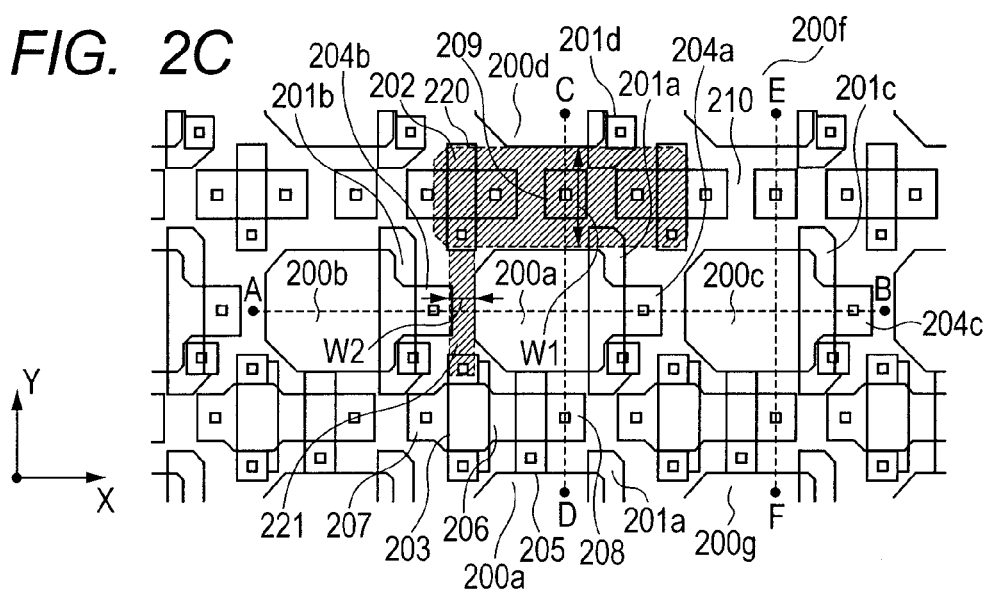
FIG. 2C is a planar layout diagram of the photoelectric conversion apparatus illustrating the first embodiment.

FIG. 2A illustrates an example of a pixel circuit to which the present invention can be applied. FIGS. 2B and 2C illustrate planar layouts of the pixel circuit. FIG. 2A illustrates a pixel cell including two photoelectric conversion elements. In the photoelectric conversion apparatus, such pixel cells are arranged in one-dimensionally or two-dimensionally and configure an imaging region. If a configuration where the pixel employs one photoelectric conversion element is employed, the pixel cell illustrated in FIG. 2A includes two pixels.

First, the pixel cell will be described using FIG. 2A. The photoelectric conversion apparatus includes photodiodes as photoelectric conversion elements 100, transfer MOS transistors 101, a reset MOS transistor 102 and an amplification MOS transistor 103. A node 104 is at the intersection of the transfer MOS transistor, the reset MOS transistor and the gate electrode of the amplification MOS transistor. Further, the photoelectric conversion apparatus includes a selection MOS transistor 105 and an output line 106. This embodiment includes two photoelectric conversion elements 100a and 100e and two transfer MOS transistors 101a and 101e. The transfer MOS transistor 101a transfers charge generated in the photoelectric conversion element 100a to the node 104. The transfer MOS transistor 101e transfers charge generated in the photoelectric conversion element 100e to the node 104. The amplification MOS transistor 103 outputs an output according to the potential of the node 104 to the output line 106 via the selection MOS transistor 105. The amplification MOS transistor 103 is a part of a source follower circuit, and the gate electrode thereof is connected to the node 104. The reset MOS transistor 102 resets the node 104 of the gate electrode of the amplification MOS transistor 103 to a predetermined potential (reset potential). The transfer MOS transistor 101a is supplied with a transfer control signal TX1. The transfer MOS transistor 101e is supplied with a transfer control signal TX2. The reset MOS transistor is supplied with a reset control signal RES. The selection MOS transistor 105 is supplied with selection control signal SEL. Each control signal control readout of the signal charge. In this embodiment, the two photoelectric conversion elements share one amplification MOS transistor 103, one reset MOS transistor 102 and one selection MOS transistor 105.

A planar layout of the photoelectric conversion apparatus is illustrated using FIG. 2B. In FIG. 2B, the photoelectric conversion apparatus includes photodiodes as photoelectric conversion elements 200, the gate electrodes 201 of the transfer MOS transistors and the gate electrodes 202 of the reset MOS transistors. The photoelectric conversion apparatus further includes the gate electrodes 203 of the amplification MOS transistors, floating diffusion regions 204, and the gate electrode 205 of the selection MOS transistor. The floating diffusion region 204 configures the node 104. Further, the photoelectric conversion apparatus includes the source region 206 of the amplification MOS transistor and the drain region 207 of the amplification MOS transistor. The source region 208 of the selection MOS transistor is connected to the output line 106. Here, the photoelectric conversion element 200a and the photoelectric conversion element 200e share the amplification MOS transistor 206, the selection MOS transistor and the reset MOS transistor 202.

A semiconductor region 209 is for supplying power voltage to the semiconductor region or/and the semiconductor substrate, and also referred to as well contact on occasions. An element isolation region 210 separates the elements from each other. An element isolation structure including insulators, such as LOCOS and STI, and a semiconductor region functioning as potential barriers against the signal charge are arranged in the element isolation region 210. Hereinafter, for the sake of description, the plurality of photoelectric conversion elements 200 in FIG. 2B is denoted by 200a-200g. The gate electrode 201a of the transfer MOS transistor corresponds to the photoelectric conversion element 200a. The floating diffusion region 204a is also arranged. The gate electrode 201b of the transfer MOS transistor corresponds to the photoelectric conversion element 200b. The floating diffusion region 204b is also arranged. The other photoelectric conversion elements 200c-200g will be described as with the elements 200a and 200b.

Further, the planar layout of the photoelectric conversion apparatus will be described using FIG. 2C. FIG. 2C is a simplified planar layout for illustrating the configuration of FIG. 2B. Referring to FIG. 2C, first element isolation regions 220 are arranged between the photoelectric conversion element 200a and the photoelectric conversion elements 200d and 200e. The second element isolation regions 221 are arranged between the photoelectric conversion element 200a and the photoelectric conversion elements 200b and 200c. Here, the first element isolation region 220 has a first width W1, and the second element isolation region 221 has a second width W2, where W1>W2. In a plane layout, the first width W1 is a width at a line segment connecting the center of mass of the photoelectric conversion element 200a and the center of mass of the photoelectric conversion element 200d or 200e. The second width W2 is a width at a line segment connecting the center of mass of the photoelectric conversion element 200a and the center of mass of the photoelectric conversion element 200b or 200c. The first element isolation regions 220 and the second element isolation regions 221 are arranged in grid-like fashion surrounding the photoelectric conversion elements. The first element isolation regions 220 and the second element isolation regions 221 illustrated in FIG. 2C are arranged in FIG. 2B. A floating diffusion region 204 is also arranged in an activation region including the photoelectric conversion element 200 defined by the element isolation regions. In this embodiment, the photoelectric conversion elements are two-dimensionally arranged in the photoelectric conversion apparatus of the first embodiment.

The photoelectric conversion apparatus is not limited to the circuit as illustrated in FIG. 2A. Instead, a configuration where further plural photoelectric conversion elements share the amplification MOS transistor or a configuration without the selection MOS transistor may be employed. Moreover, a case where the pixel cell includes only one photoelectric conversion element may be adopted. The planar layout as illustrated in FIG. 2B is not necessarily employed. Embodiments of the present invention will hereinafter be described using the drawings.

First Embodiment

Figure 1A:
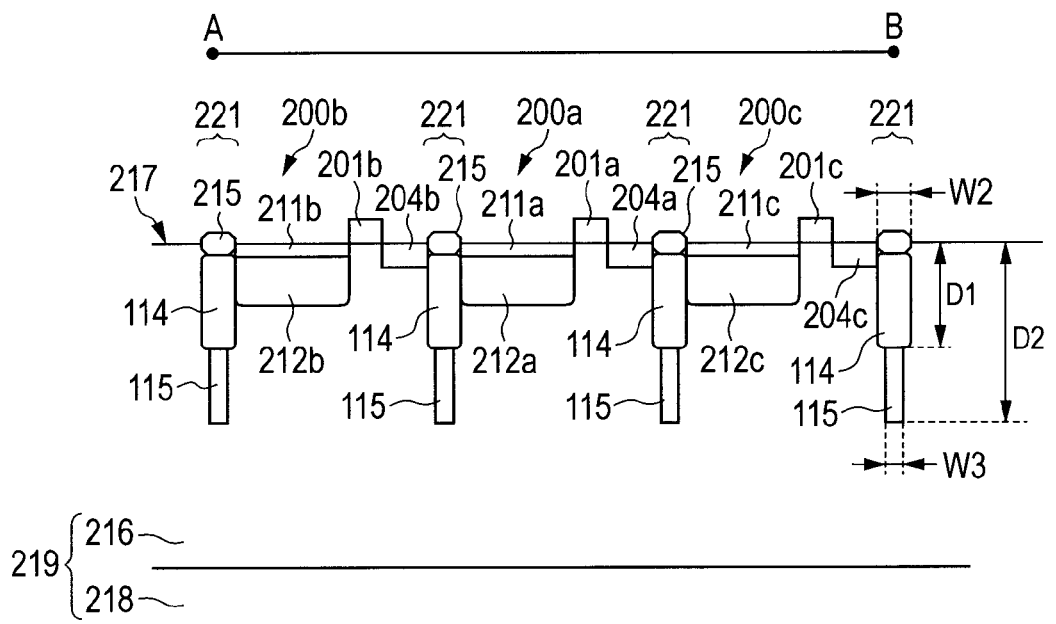
FIGS. 1A and 1B are schematic sectional views of a photoelectric conversion apparatus illustrating a first embodiment.
Figure 1B:
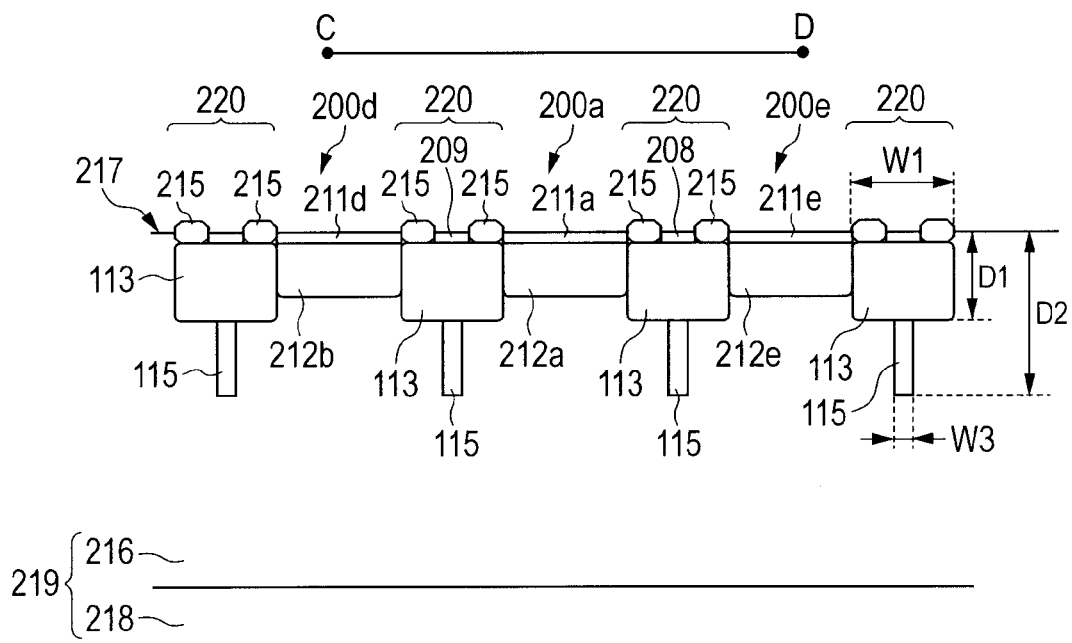

A photoelectric conversion apparatus of this embodiment will be described using FIGS. 1A and 1B. FIG. 1A is a schematic sectional view taken along line AB of FIG. 2B. FIG. 1B is a schematic sectional view taken along line CD of FIG. 2B. In FIGS. 1A and 1B, configurational elements corresponding to the elements of FIG. 2B are assigned with identical symbols, description of which is omitted. In this embodiment, a case where the signal charge is electrons will be described. Further, in this embodiment, the photoelectric conversion elements, or the pixels, are arranged in a matrix form along a first direction Y and a second direction X. The second direction X and the first direction Y are orthogonal to each other.

A semiconductor region 216 and a base substrate 218 are illustrated in FIGS. 1A and 1B. A configuration including the semiconductor region 216 and the base substrate 218 is referred to as a semiconductor substrate 219. The semiconductor region 216 is formed in or on the base substrate 218. More specifically, the semiconductor region 216 is formed, for example, by ion implantation into the base substrate 218 or by providing an epitaxial layer on the base substrate 218. In this embodiment, the semiconductor region 216 is a P type (first conductive type) semiconductor region. The base substrate 218 is of an N type (second conductive type). The conductive types of the semiconductor region 216 and the base substrate 218 may be of the N type or the P type. The main surface 217 of the semiconductor substrate 219 is also illustrated. In this embodiment, the main surface 217 is a plane including the light receiving surface of the photoelectric conversion element. The photoelectric conversion element 200 includes a P type semiconductor region 211 that can also function as a surface protective layer, and an N type semiconductor region 212 that can also function as a charge accumulator. The floating diffusion region 204 is made of an N type semiconductor region. A P type semiconductor region 211$a$ and an N type semiconductor region 212$a$ correspond to the photoelectric conversion element 200$a$. A P type semiconductor region 211$b$ and an N type semiconductor region 212$b$ correspond to the photoelectric conversion element 200$b$. Likewise, other photoelectric conversion elements 200$c$-200$e$ are configured. Here, the photoelectric conversion element 200$a$ is a first photoelectric conversion element. The photoelectric conversion elements 200$d$ and 200$e$ are second photoelectric conversion elements. The photoelectric conversion elements 200$b$ and 200$c$ are third photoelectric conversion elements. The photoelectric conversion elements 200$f$ and 200$g$ are fourth photoelectric conversion elements. In this embodiment, a gate insulation film is omitted.

In the photoelectric conversion apparatus as described above, an element isolation structure (herein, LOCOS) 215 is arranged on the main surface of the semiconductor substrate of the first element isolation region 220 and the second element isolation region 221. P type first semiconductor region 113 and second semiconductor region 114 are arranged under the element isolation structure 215. The first and second semiconductor regions 113 and 114 have impurity concentrations higher than a concentration of a P type semiconductor region 216 and can be potential barriers against the signal charge. The semiconductor region that can be potential barriers against the signal charge is, for example, a semiconductor region of a conductive type where the signal charge becomes minority carriers. In this embodiment, the first semiconductor region 113 has the same width as the width W1 of the first element isolation region 220; the second semiconductor region 114 has the same width as the width W2 of the second element isolation region 221. However, the widths are not limited thereto. The first semiconductor region 113 and the second semiconductor region 114 extend from a lower part of the element isolation structure 215 to a first depth D1 equal with respect to each other. The first semiconductor region 113 and the second semiconductor region 114 have the same impurity concentration as each other. Here, the floating diffusion regions corresponding to the first photoelectric conversion element 200$a$ are arranged between the first photoelectric conversion element 200$a$ and the third photoelectric conversion elements 200$b$ and 200$c$. In this embodiment, the floating diffusion region is arranged between the first photoelectric conversion element 200$a$ and the second semiconductor region 144. Other devices such as transistors (208 and 209) may be arranged on the first and second semiconductor regions. The first semiconductor region 113 and the second semiconductor region 114 surround each photoelectric conversion element in grid-like fashion.

In this embodiment, respective third semiconductor regions 115 are arranged under the first semiconductor region 113 and the second semiconductor region 114. The third semiconductor regions 115 have a third width W3, and arranged from the bottoms of the first and second semiconductor regions to a second depth D2. Since such third semiconductor region 115 is provided, it can be suppressed that charge generated in a depth of the semiconductor substrate 119 of the photoelectric conversion element 200$a$ unevenly leaks between the photoelectric conversion elements adjacent to each other.

The first to third semiconductor regions 113 to 115 are formed according to a method described below. The element isolation structure 215 is formed in the first and second element isolation region of the semiconductor substrate. Subsequently, a first mask such as a photoresist having openings with widths W1 and W2 is provided in a region where the first and second semiconductor regions 113 and 114 are to be formed, on the semiconductor substrate 219. Impurity ions for forming the P type semiconductor region using the first mask are implanted into the semiconductor substrate 219 by a first dosage at the first energy. This ion implantation forms the first semiconductor region 113 and the second semiconductor region 114. Next, after the first mask has been removed, a second mask such as a photoresist having an opening with width W3 is provided in a region where the third semiconductor region 115 is to be formed, on the semiconductor substrate 219. Impurity ions for forming the P type semiconductor region using the second mask is implanted into the semiconductor substrate 219 by a second dosage at a second energy. This ion implantation forms the third semiconductor region 115. In this embodiment, the first dosage and the second dosage are equal to each other. The first energy is smaller than the second energy. The first and second semiconductor regions 113 and 114 may separately be formed. The order may arbitrarily be selected. For example, the third semiconductor region 115 may be formed before the first and second semiconductor regions.

Figure 3A:
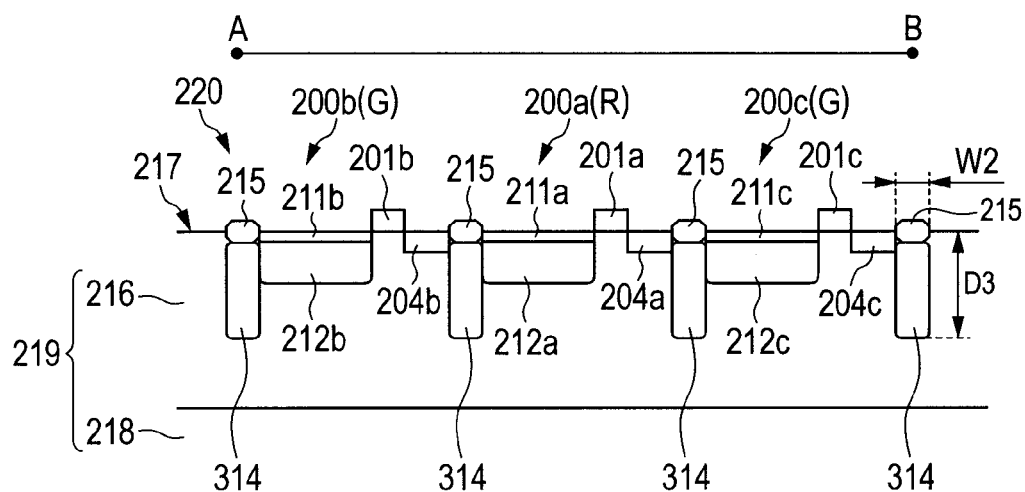
FIGS. 3A and 3B are schematic sectional views of a photoelectric conversion apparatus for comparison for illustrating the first embodiment.
Figure 3B:
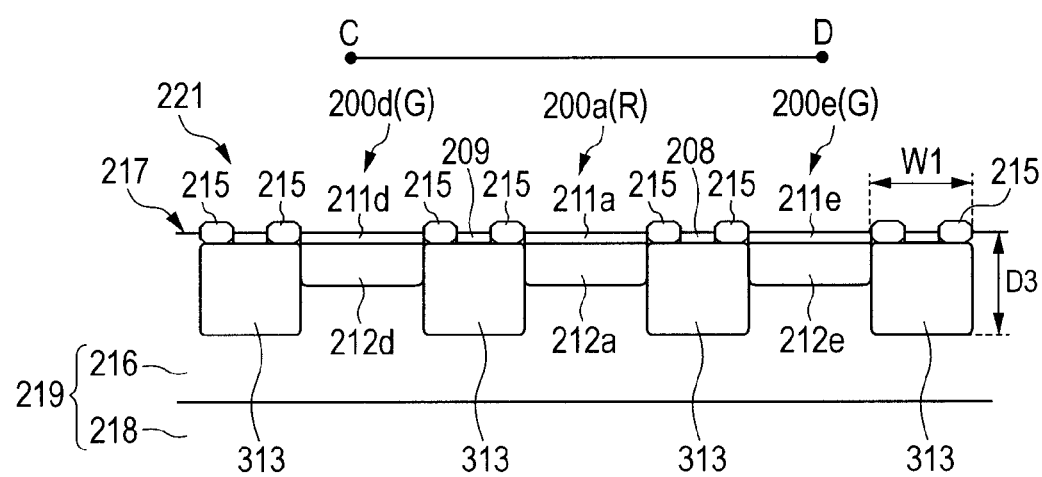

Next, comparison with this embodiment will be made using FIGS. 3A and 3B. FIGS. 3A and 3B are schematic sectional views of a photoelectric conversion apparatus corresponding to FIGS. 1A and 1B. In FIGS. 3A and 3B, configurational elements corresponding to the elements of FIGS. 1A, 1B, 2A and 2B are assigned with identical symbols, description of which is omitted. In a planar layout of the photoelectric conversion apparatus, widths of element isolation regions arranged between the photoelectric conversion elements vary in some cases. In FIGS. 3A and 3B, semiconductor regions (313 and 314) that can be potential barriers against signal charge are formed on the entire surface of the photoelectric conversion apparatus at the same time. Accordingly, the depth (D3) and the impurity concentration of semiconductor regions (313 and 314) that can be potential barriers against the signal charge become equal to each other. However, the widths (W1 and W2) are different from each other. In such a configuration, as shown in FIGS. 3A and 3B, in a case that signal charges are generated at a depth of the semiconductor substrate 219 in the photoelectric conversion element 200$a$, amounts of signal charge leakage (cross talk) vary with respect to adjacent photoelectric conversion elements 200$b$, 200$c$, 200$d$ and 200$e$. This is because the signal charge randomly moves, a probability of disappearance of the signal charge is constant and thereby leakage amounts of signal charge into the adjacent photoelectric conversion elements vary according to the width of the P type semiconductor region and the widths of the first and second regions. And, when different potential barriers exist, amounts of the signal charges flowing over the different potential barriers would be different. Thus, it is difficult for the signal charge to leak into the photoelectric conversion element 200e with a large distance from the photoelectric conversion element 200a and it is easy to leak into the photoelectric conversion element 200c with a small distance from the photoelectric conversion element 200a. Even if the floating diffusion region exists between the photoelectric conversion elements, most of charge generated at depths can leak into the photoelectric conversion elements in some cases. If the signal charge has variations of leakage amounts according to arrangement of the photoelectric conversion elements as described above, for example correction is required to acquire white balance information.

On the other hand, in the photoelectric conversion apparatus shown in FIGS. 1A and 1B, when charge is generated at the depth of the semiconductor substrate 219 of the photoelectric conversion element 200a, the charge is blocked in any direction by the third semiconductor region 115 with the width W3. Accordingly, movement of charge between the photoelectric conversion elements are evenly controlled.

In this embodiment, the element isolation structure 215 is provided in the element isolation region. However, a configuration where only the P type first and second semiconductor regions 113 and 114 are provided may be employed. Here, a boundary of the semiconductor region is a point where the impurity concentration becomes the impurity concentration of the P type semiconductor region 216 in the impurity concentration profile. If the semiconductor region 216 is of the N type, the boundary is the point where the net concentration becomes zero in the impurity concentration profile. The width of the semiconductor region or the region is a length of the semiconductor region or the region projected on the main surface 217 of the semiconductor substrate. For example, the width is the length on the line segment connecting the centers of mass of the photoelectric conversion elements on the main surface 217 in a case where the elements are projected on the main surface 217 of the semiconductor substrate. The depth of the semiconductor region is the length of the semiconductor region from the main surface 217 of the semiconductor substrate into the semiconductor substrate.

Second Embodiment

Figure 4A:
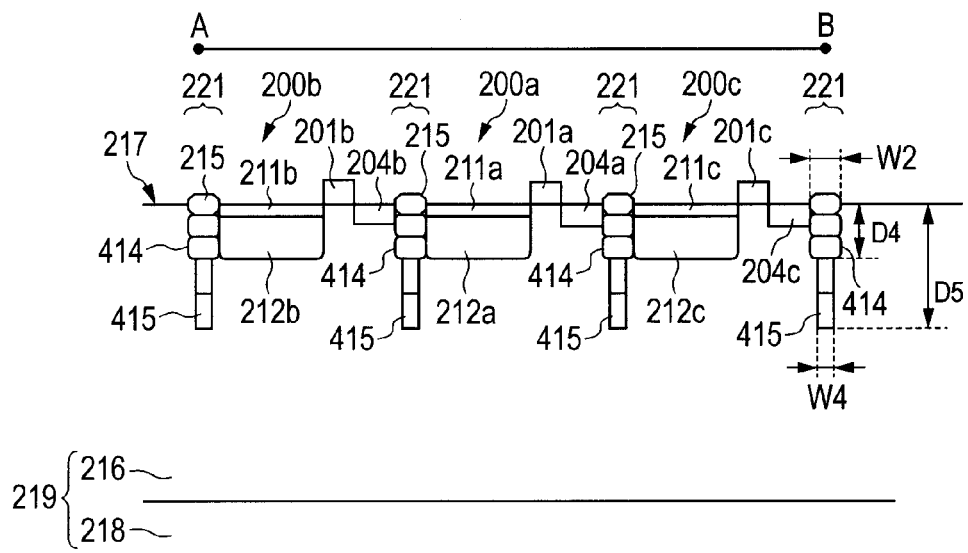
FIGS. 4A and 4B are schematic sectional views of a photoelectric conversion apparatus illustrating a second embodiment.
Figure 4B:
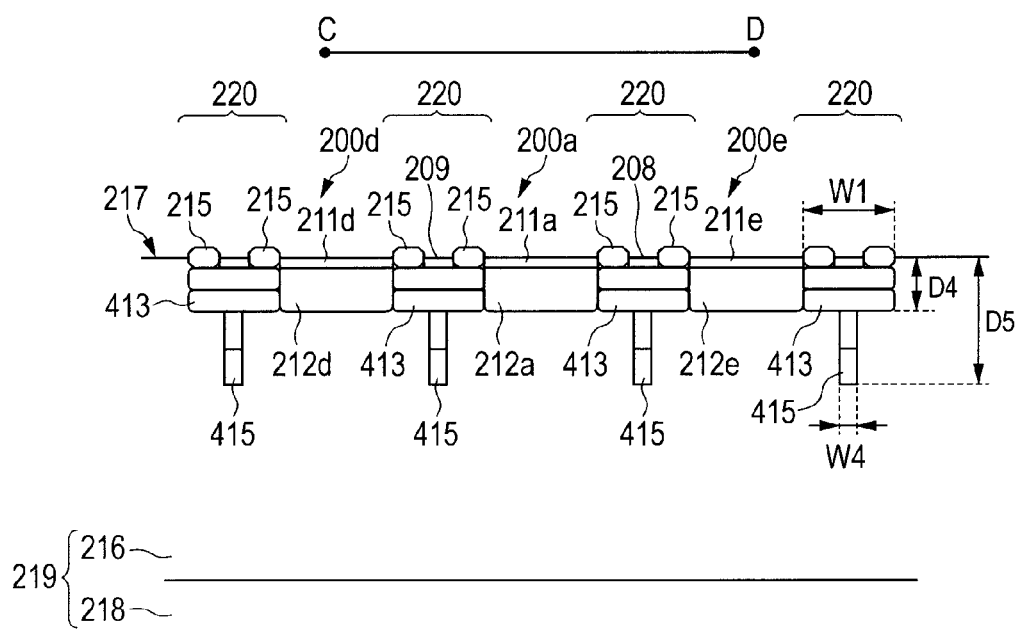

A photoelectric conversion apparatus of this embodiment will be described using FIGS. 4A and 4B. FIGS. 4A and 4B are schematic sectional views of a photoelectric conversion apparatus corresponding to FIGS. 1A and 1B. Configurational elements having similar functions are assigned with identical symbols, description of which is omitted.

In this embodiment, the configurations of the first to third semiconductor regions are different from the configurations of the first embodiment. In FIGS. 4A and 4B, the first semiconductor region 413 is arranged to a depth D4, and includes two semiconductor regions. The second semiconductor region 414 is arranged to the depth D4, and includes two semiconductor regions. Third semiconductor regions 415 are arranged from the bottoms of the first and second semiconductor regions to a depth D5, and includes two semiconductor regions. That is, in this embodiment, the semiconductor regions that can function as potential barriers against the signal charge include a plurality of semiconductor regions.

The depth D4 is the same as the depth of the lower surface of the N type semiconductor region 212 of the photoelectric conversion element. Such a configuration allows charge generated at a depth of the semiconductor substrate deeper than the semiconductor region 212 of the photoelectric conversion element to be separated by the third semiconductor region 415 with width W4 in both FIGS. 4A and 4B. If third semiconductor region 415 is provided at a part shallower than the bottom of the N type semiconductor region 212, it is difficult to sufficiently separate the adjacent photoelectric conversion elements. That is, if the third semiconductor regions 415 with the same width are provided, the regions 415 can be arranged at a position equal to or deeper than the position of the lower surface of the N type semiconductor region 212, whose upper portion functions as a charge accumulator of the photoelectric conversion element. For example, a configuration where the first semiconductor region 413 and the second semiconductor region 414 include another semiconductor region in the depth direction of the semiconductor substrate and a configuration where the upper surface of the third semiconductor region 415 is disposed deeper than depth D4 may be employed. The width of the first semiconductor region 413 is W1. The width of the second semiconductor region 414 is W2. The width of the third semiconductor region 415 is W4. These widths have relationship W1>W2>W4.

Figure 5A:
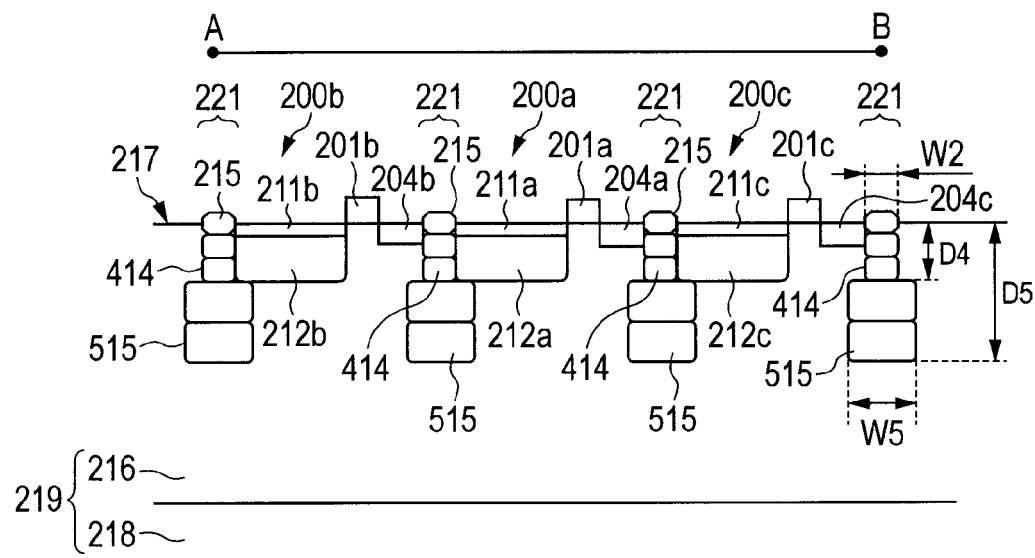
FIGS. 5A and 5B are schematic sectional views of the photoelectric conversion apparatus illustrating the second embodiment.
Figure 5B:
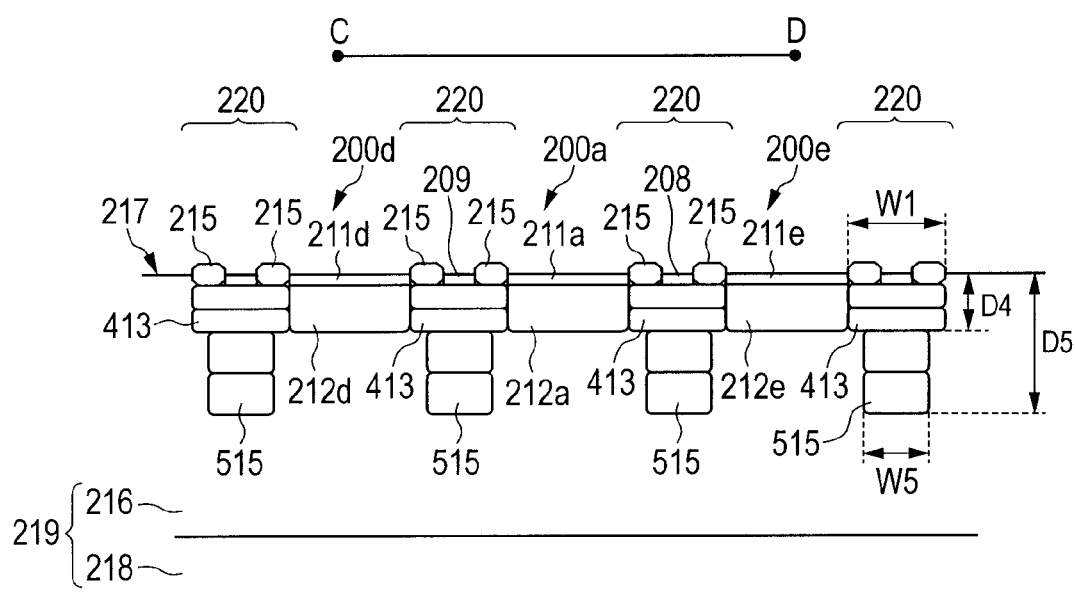

FIGS. 5A and 5B illustrate a modification of this embodiment. FIGS. 5A and 5B are a schematic sectional view of the photoelectric conversion apparatus corresponding to FIGS. 4A and 4B. Configurational elements having similar functions are assigned with identical symbols, description of which is omitted. The configuration of FIGS. 5A and 5B different from the configuration of FIGS. 4A and 4B is the width W5 of the third semiconductor region 515. In FIGS. 4A and 4B, the widths of the first to third semiconductor regions have the relationship W1>W2>W4. On the other hand, in FIGS. 5A and 5B, the relationship is W1>W5>W2. Here, in FIGS. 5A and 5B, a semiconductor region that functions as potential barriers having the same width against charge generated at a depth of the semiconductor substrate is provided. Accordingly, leakage between the adjacent photoelectric conversion elements can be suppressed. As described above, the relationship between the widths of the first and second semiconductor regions and the width of the third semiconductor region may arbitrarily be set.

Third Embodiment

Figure 6A:
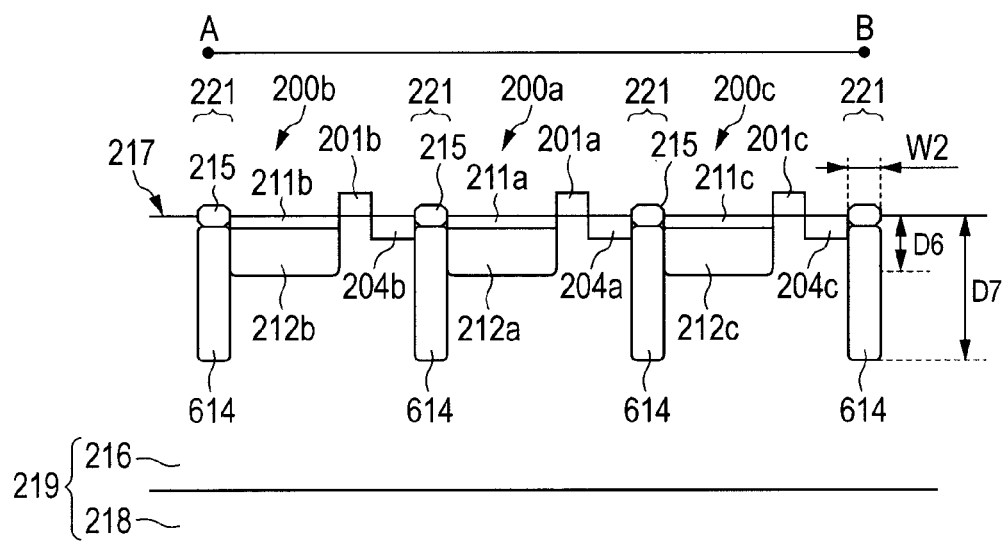
FIGS. 6A and 6B are schematic sectional views of a photoelectric conversion apparatus illustrating a third embodiment.
Figure 6B:
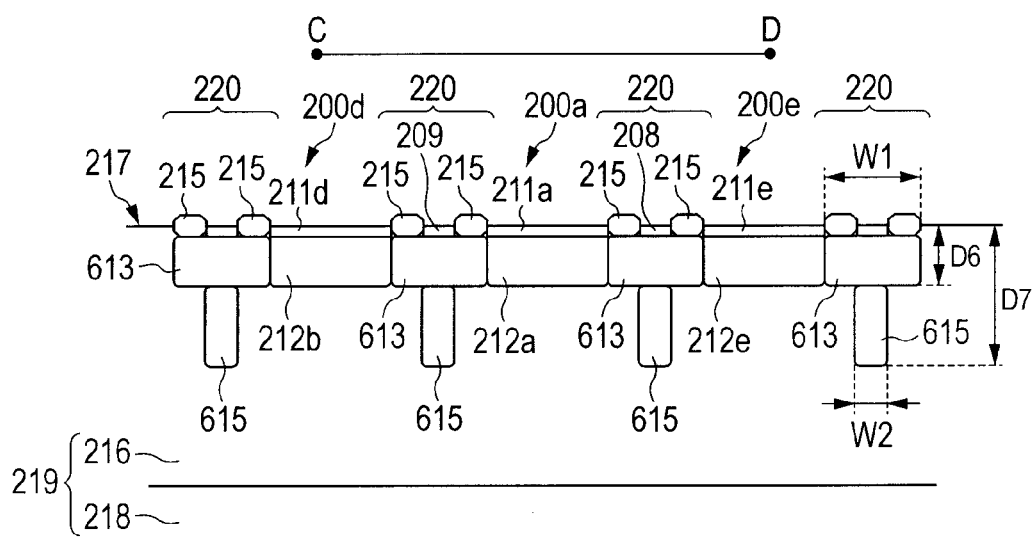

A photoelectric conversion apparatus of this embodiment will be described using FIGS. 6A and 6B. FIGS. 6A and 6B are schematic sectional views of a photoelectric conversion apparatus corresponding to FIGS. 1A and 1B. Configurational elements having similar functions are assigned with identical symbols, description of which is omitted.

This embodiment is different from the first embodiment in the structures of the first to third semiconductor regions. In FIG. 6A, the second semiconductor region 614 has the width W2 and arranged to a depth D7. In FIG. 6B, the first semiconductor region 613 has the width W1 and arranged to a depth D6. Here, third semiconductor region having the width W2 and arranged to a depth D7 is only arranged under the first semiconductor region 613. In other words, in FIG. 6A, the second semiconductor region 614 integrally includes third semiconductor region 615. Such a configuration can also suppress that charge generated in a depth of the semiconductor substrate 119 of the photoelectric conversion element 200a unevenly leaks between the adjacent photoelectric conversion elements.

In this embodiment, the configuration where the second semiconductor region 614 integrally includes the third semiconductor region 615 has been described. However, a configuration may be employed where the width of the third semiconductor region 615 equals to W1, the first semiconductor region 613 integrally includes the third semiconductor region 615, and the third semiconductor region is arranged under the second semiconductor region 614.

Fourth Embodiment

Figure 7A:
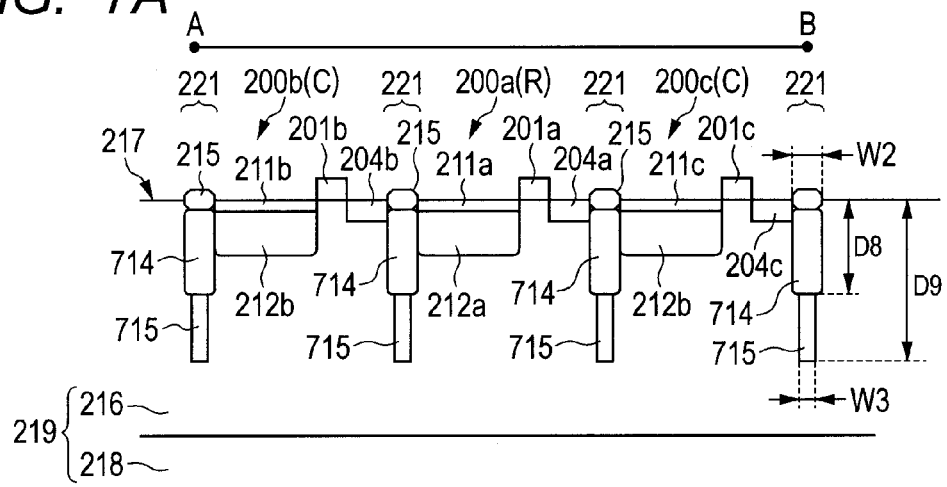
FIGS. 7A, 7B and 7C are schematic sectional views of a photoelectric conversion apparatus illustrating a fourth embodiment.
Figure 7B:
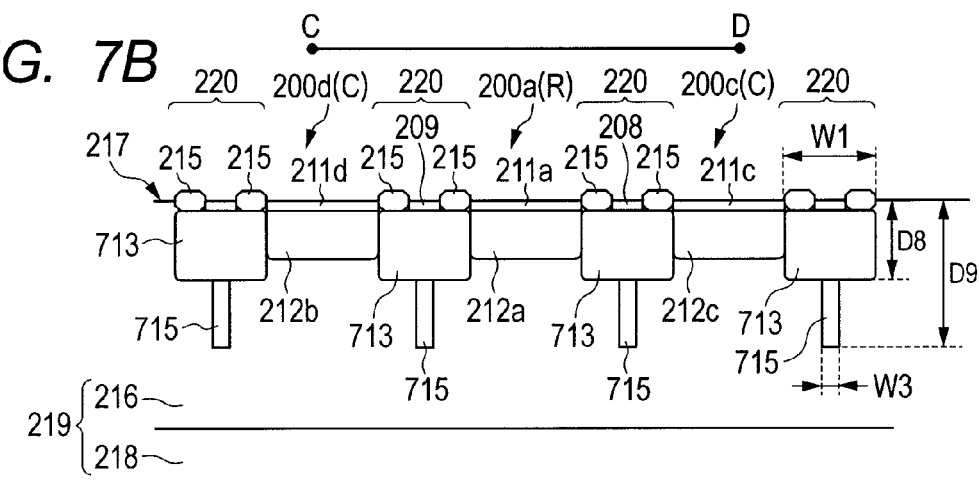
Figure 7C:
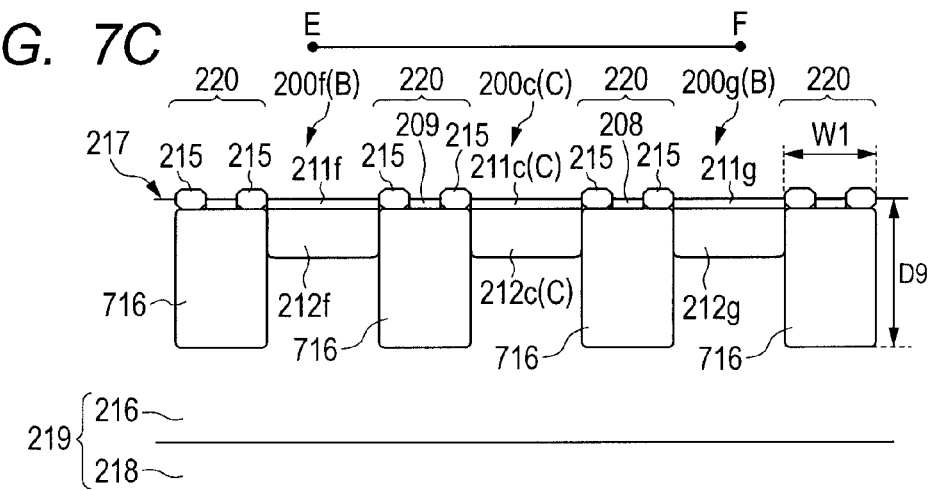

A photoelectric conversion apparatus of this embodiment will be described using FIGS. 7A to 7C. FIGS. 7A and 7B are schematic sectional views of a photoelectric conversion apparatus corresponding to FIGS. 1A and 1B, respectively. FIG. 7C is a schematic sectional view of the photoelectric conversion apparatus corresponding to the view taken along line EF in FIG. 2B. In FIGS. 7A to 7C, configurational elements having functions similar to the elements of FIGS. 1A and 1B are assigned with identical symbols, description of which is omitted.

The photoelectric conversion apparatus of this embodiment has color filters. The color filters of this embodiment are of a Bayer color array. A color filter of red (R) is arranged above the first photoelectric conversion element 200*a*. Color filters of green (G) are arranged above the second photoelectric conversion elements 200*d* and 200*e* and the third photoelectric conversion elements 200*b* and 200*c*. Color filters of blue (B) are arranged above the forth photoelectric conversion elements 200*f* and 200*g*. These elements are hereinafter denoted by 200*a*(R), 200*b*(G) and 200*f*(B). Here, light incident on the photoelectric conversion element 200*a*(R) has a long wavelength. Accordingly, the light reaches a depth of the semiconductor substrate, and generates charge at the depth of the semiconductor substrate. Light incident on the photoelectric conversion elements 200*b*(G) and 200*f*(B) has wavelengths shorter than the wavelength of the light incident on the photoelectric conversion element 200*a*(R), and generates charge at a shallow part of the semiconductor substrate. Therefore, in this embodiment, the semiconductor regions at a depth of the substrate that are arranged adjacent to the photoelectric conversion element 200*a*(R) are made to be equal in width. This configuration reduces variation of charge leaking into the photoelectric conversion elements.

Referring to FIG. 7A, second element isolation region 221 is provided with a P type semiconductor region 714 that has the width W2 and is arranged to a depth D8, and a P type semiconductor region 715 that has the width W3 and is arranged from the bottom of the semiconductor region 714 to a depth D9. Referring to FIG. 7B, the first element isolation region 220 is provided with a P type semiconductor region 713 that has the width W1 and is arranged to the depth D8, and the P type semiconductor region 715 that has the width W3 and is arranged from the bottom of the semiconductor region 713 to a depth D9. Referring to FIG. 7C, the first element isolation region 220 is provided with a P type semiconductor region 716 that has the width W1 and is arranged to the depth D9. Thus, the P type semiconductor regions 716 that have the same width W3 and the same depth are arranged at least in the first element isolation region 220 and the second element isolation region 221 adjacent to the photoelectric conversion element 200*a*(R). Such a configuration can also uniformize amounts of signal charge leaking into the adjacent photoelectric conversion elements.

A following configuration may be employed in the first element isolation region 220 that is not adjacent to the photoelectric conversion element 200*a*(R) in FIG. 7C of this embodiment. For example, the first semiconductor region 713 with the width W1 is arranged, and a P type semiconductor region with a width smaller than W1 may be arranged thereunder. Instead, the first semiconductor region 713 with the width W1 is arranged, and the P type semiconductor region is not necessarily arranged thereunder. The P type semiconductor region with the width W3 can be arranged as with the other embodiments.

The width W3 may be larger than the width W2 or W1. The P type semiconductor region that can function as potential barriers against the signal charge may include a plurality of semiconductor regions. In this embodiment, the configuration employing the color filters of the Bayer color array has been described. However, the color filters are not limited to the Bayer color array. Color filters of complementary colors may be employed. At least the widths at a depth of the substrate of the semiconductor regions arranged adjacent to the photoelectric conversion element on which a color filter corresponding to light with the longest wavelength is arranged may be made to be equal.

(Application to Imaging System)

In this embodiment, a case where the photoelectric conversion apparatus having been described in the first to fourth embodiments is applied to an imaging system will be described using FIG. 8. The imaging system is a digital still camera, a digital video camera or a digital camera for a mobile phone.

Figure 8:
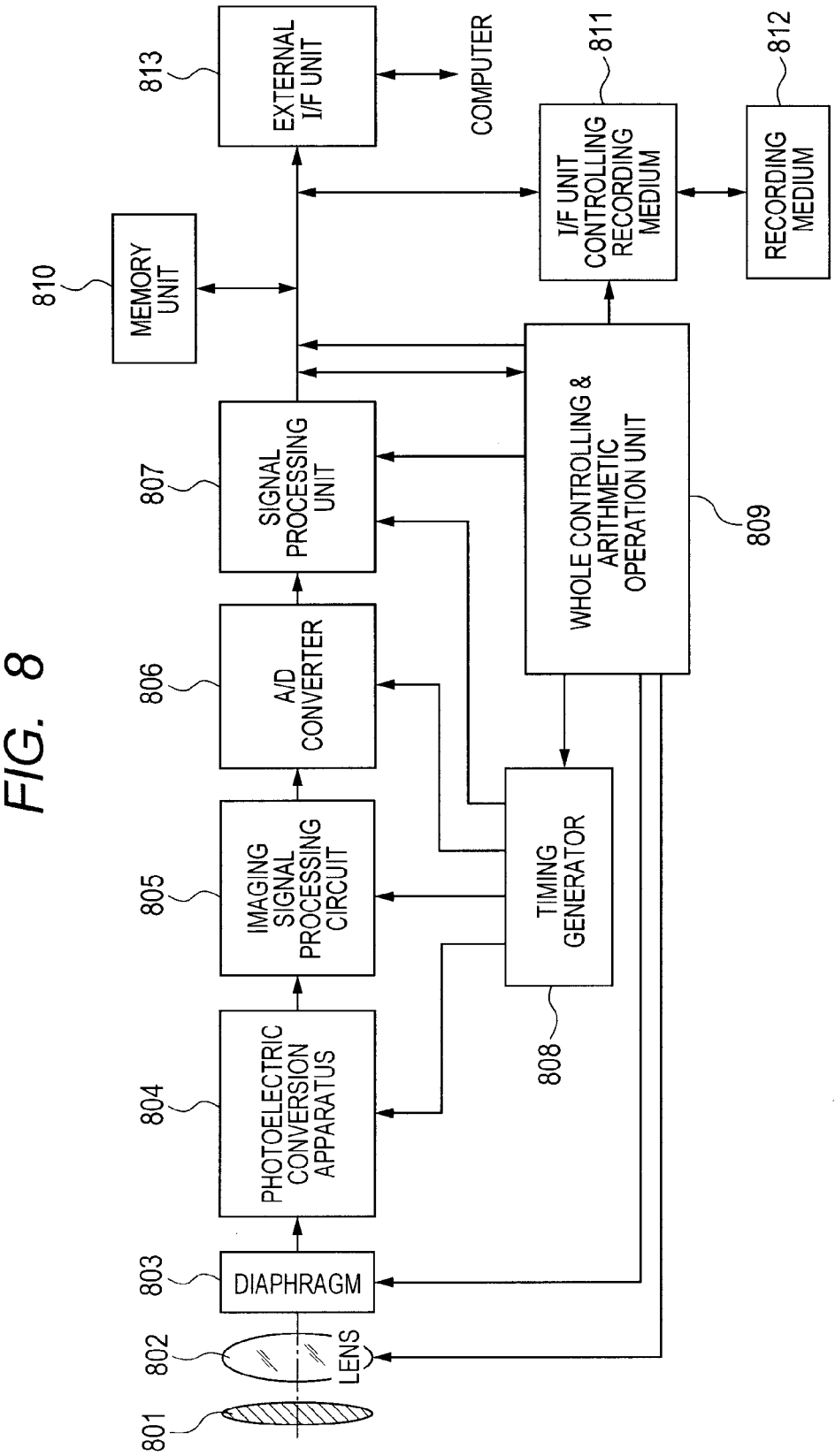
FIG. 8 is a block diagram illustrating an imaging system.

FIG. 8 is a diagram illustrating a configuration of a digital still camera. An optical image of a subject is formed on an imaging surface of a photoelectric conversion apparatus 804 by an optical system including a lens 802. A barrier 801 that has a protecting function and also serves as a main switch can be arranged around the outside of the lens 802. A diaphragm 803 for adjusting an amount of light emitted therefrom can be arranged at the lens 802. Imaged signals output from the photoelectric conversion apparatus 804 in a plurality of channels are subjected to processing, such as various types of correction and clump by an imaging signal processing circuit 805. The imaged signals output in the plurality of channels from the imaging signal processing circuit 805 are subjected to analog to digital conversion in an A/D converter 806. The image data output from the A/D converter 806 is subjected to various types of correction and data compression by a signal processing unit (image processor) 807. The photoelectric conversion apparatus 804, the imaging signal processing circuit 805, the A/D converter 806 and the signal processing unit 807 operate according to a timing signal generated by a timing generator 808. Each block is controlled by a whole controlling and arithmetic operation unit 809. In addition thereto, the camera further includes a memory unit 810 for temporarily storing the image data and a recording medium control interface 811 for recording and reading the image on or from a recording medium. The recording medium 812 includes a semiconductor memory and is detachable. Further, the recording medium 812 may include an external interface (I/F) unit 813 for communicating with an external computer. Here, the blocks 805 to 808 may be formed on the same chip as the chip of the photoelectric conversion apparatus 804.

Thus, the photoelectric conversion apparatus of the present invention is applied to the imaging system. The photoelectric conversion apparatus of the present invention is used and thereby the amount of signal charge leakage between the pixels (cross talk) is uniformized. Accordingly, the image processing in the signal processing circuit becomes easy in comparison with the case with unevenness. Therefore, the configuration of the signal processing unit of the imaging system can be simplified.

Some embodiments of the present invention have been described above. The present invention is not limited to each embodiment, but may appropriately be modified. For example, the arrangement of the semiconductor region is not limited to the manner having been described. Instead, the semiconductor region may be separated into a plurality of regions or integrally formed in one region. The polarity of charge, the polarity of the semiconductor region and the polarity of the transistor may appropriately be modified. Likewise, the pixel arrangement is not limited to the matrix form. Further, the configuration of each embodiment can appropriately be combined.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-279910, filed Dec. 9, 2009, which is hereby incorporated by reference herein in its entirety.

What is claimed is:

1. A photoelectric conversion apparatus comprising:
a plurality of photoelectric conversion elements including a first photoelectric conversion element, a second photoelectric conversion element adjacent to the first photoelectric conversion element, and a third photoelectric conversion element adjacent to the first photoelectric conversion element; and
a plurality of transistors each for transferring a signal charge generated in each of the plurality of photoelectric conversion elements, wherein the plurality of photoelectric conversion elements and the plurality of transistors are arranged in a semiconductor substrate, and wherein
a first semiconductor region of a first width having a first conductivity type so as to contain the signal charge as a minority carrier is arranged between the first and second photoelectric conversion elements,
a second semiconductor region of a second width smaller than the first width having the first conductivity type is arranged between the first and third photoelectric conversion elements, and
a third semiconductor region of a third width and having the first conductivity type is arranged under the first and second semiconductor regions.

2. The photoelectric conversion apparatus according to claim 1, wherein
the plurality of transistors for transferring the signal charge are arranged each one correspondingly to each one of the plurality of photoelectric conversion elements, such that one of the plurality of transistors for transferring the signal charge is arranged between the first and third photoelectric conversion elements.

3. The photoelectric conversion apparatus according to claim 1, wherein
the first, second and third semiconductor regions function as potential barriers against the signal charge.

4. The photoelectric conversion apparatus according to claim 1, wherein
each of the first and second semiconductor regions comprises a plurality of semiconductor regions.

5. The photoelectric conversion apparatus according to claim 1, wherein
the third semiconductor region comprises a plurality of semiconductor regions.

6. The photoelectric conversion apparatus according to claim 1, wherein
the third width equals to the second width.

7. The photoelectric conversion apparatus according to claim 1, wherein
each of the plurality of photoelectric conversion elements comprises a semiconductor region of a second conductivity type for accumulating the signal charge, and
an upper surface of the third semiconductor region is arranged in the semiconductor substrate at a position of the same depth as, or at a position deeper than a lower surface of the semiconductor region of the second conductivity type.

8. The photoelectric conversion apparatus according to claim 1, further comprising
an element isolation structure including an insulator arranged above the first or second semiconductor region.

9. The photoelectric conversion apparatus according to claim 1, further comprising
a color filter arranged above the plurality of photoelectric conversion elements.

10. The photoelectric conversion apparatus according to claim 9, wherein
the color filter comprises color filters of a plurality of colors, and
a color filter of a color corresponding to the longest wave length among the color filters of the plurality of colors is arranged above the first photoelectric conversion element.

11. The photoelectric conversion apparatus according to claim 9, wherein
the plurality of photoelectric conversion elements further include a fourth photoelectric conversion element,
the color filters of the plurality of colors include color filters of red, blue and green arranged in a Bayer color array,
the color filter of red is arranged above the first photoelectric conversion element,
the color filters of green are arranged above the second and third photoelectric conversion elements,
the color filters of blue is arranged above the fourth photoelectric conversion element,
the first semiconductor region is arranged between the fourth and third photoelectric conversion elements,
the second semiconductor region is arranged between the fourth and second photoelectric conversion elements,
the third semiconductor region is arranged at least under the first semiconductor region between the first and second photoelectric conversion elements, and under the second semiconductor region between the first and third photoelectric conversion elements.

12. The photoelectric conversion apparatus according to claim 11, wherein
the third semiconductor region is arranged under the first semiconductor region between the fourth and third photoelectric conversion elements, and under the second semiconductor region between the fourth and second photoelectric conversion elements.

13. The photoelectric conversion apparatus according to claim 1, wherein
the plurality of photoelectric conversion elements are arranged two-dimensionally, such that the first and second photoelectric conversion elements are arranged in a first direction, the first and third photoelectric conversion elements are arranged in a second direction, and the first and second directions cross each other perpendicularly.

14. The photoelectric conversion apparatus according to claim 1, wherein
the first and second semiconductor regions extend to the same depth.

15. An imaging system comprising:
the photoelectric conversion apparatus according to claim 1, and
a signal processing unit for processing a signal outputted from the photoelectric conversion apparatus.

* * * * *